(12) United States Patent
Alam et al.

(10) Patent No.: US 8,817,530 B2
(45) Date of Patent: Aug. 26, 2014

(54) DATA-MASKED ANALOG AND DIGITAL READ FOR RESISTIVE MEMORIES

(71) Applicant: Everspin Technologies, Inc., Chandler, AZ (US)

(72) Inventors: Syed M. Alam, Austin, TX (US); Thomas Andre, Austin, TX (US)

(73) Assignee: EverSpin Technologies, Inc., Chandler, AZ (US)

( * ) Notice: Subject to any disclaimer, the term of this patent is extended or adjusted under 35 U.S.C. 154(b) by 36 days.

(21) Appl. No.: 13/657,002

(22) Filed: Oct. 22, 2012

(65) Prior Publication Data

US 2013/0128650 A1    May 23, 2013

Related U.S. Application Data

(60) Provisional application No. 61/561,143, filed on Nov. 17, 2011.

(51) Int. Cl.
| | | |
|---|---|---|
| *G11C 7/10* | (2006.01) | |
| *G11C 7/00* | (2006.01) | |
| *G11C 7/12* | (2006.01) | |
| *G11C 11/00* | (2006.01) | |
| *G11C 11/16* | (2006.01) | |
| *G11C 11/02* | (2006.01) | |
| *G11C 13/00* | (2006.01) | |

(52) U.S. Cl.
CPC .. *G11C 7/10* (2013.01); *G11C 7/12* (2013.01); *G11C 7/00* (2013.01); *G11C 7/1084* (2013.01); *G11C 11/00* (2013.01); *G11C 11/02* (2013.01); *G11C 13/0069* (2013.01); *G11C 13/004* (2013.01)

USPC ........... 365/158; 365/148; 365/163; 365/171; 365/189.05; 365/189.15

(58) Field of Classification Search
CPC .............. G11C 7/10; G11C 7/12; G11C 7/00; G11C 7/1084; G11C 13/0069; G11C 13/004; G11C 11/00; G11C 11/02
USPC ........ 365/148, 158, 163, 171, 189.05, 189.15
See application file for complete search history.

(56) References Cited

U.S. PATENT DOCUMENTS

| | | | |
|---|---|---|---|
| 4,291,604 A * | 9/1981 | Scott et al. ...................... | 84/692 |
| 6,052,302 A | 4/2000 | Moyer et al. | |
| 7,263,017 B2 | 8/2007 | Voshell | |
| 7,830,726 B2 | 11/2010 | Huang et al. | |
| 7,936,610 B1 | 5/2011 | Melcher et al. | |
| 2004/0015666 A1 * | 1/2004 | Rojas et al. .................... | 711/159 |
| 2008/0082730 A1 * | 4/2008 | Kim et al. ..................... | 711/103 |
| 2010/0277974 A1 | 11/2010 | Yang | |
| 2011/0035637 A1 | 2/2011 | Baker | |
| 2011/0170348 A1 * | 7/2011 | Cornwell et al. ........ | 365/185.03 |

OTHER PUBLICATIONS

PCT Search Report and Written Opinion mailed Apr. 9, 2013 in PCT/US12/65848.

* cited by examiner

*Primary Examiner* — Ly D Pham
(74) *Attorney, Agent, or Firm* — Ingrassia Fisher & Lorenz, P.C.

(57) ABSTRACT

An analog read circuit measures the resistance of each of a plurality of bits in an array of resistive memory elements. Data stored within a latch determines whether to selectively enable the analog read circuit. In an alternate embodiment, a sense amplifier is coupled to the latch and the array, and the data stored in the latch determines whether to selectively enable the sense amplifier.

15 Claims, 5 Drawing Sheets

DATA-MASKED ANALOG AND DIGITAL READ FOR RESISTIVE MEMORIES

CROSS REFERENCE TO RELATED APPLICATION

This application claims the benefit of U.S. Provisional Application No. 61/561,143 filed 17 Nov. 2011.

TECHNICAL FIELD

The exemplary embodiments described herein generally relate to integrated magnetic devices and more particularly relate to methods for determining resistances of bit cells of magnetoresistive memories during test and failure analysis.

BACKGROUND

Magnetoelectronic devices, spin electronic devices, and spintronic devices are synonymous terms for devices that make use of effects predominantly caused by electron spin. Magnetoelectronics are used in numerous information devices to provide non-volatile, reliable, radiation resistant, and high-density data storage and retrieval. The numerous magnetoelectronics information devices include, but are not limited to, Magnetoresistive Random Access Memory (MRAM), magnetic sensors, and read/write heads for disk drives.

Typically an MRAM includes an array of magnetoresistive memory elements. Each magnetoresistive memory element typically has a structure that includes multiple magnetic layers separated by various non-magnetic layers, such as a magnetic tunnel junction (MTJ), and exhibits an electrical resistance that depends on the magnetic state of the device. Information is stored as directions of magnetization vectors in the magnetic layers. Magnetization vectors in one magnetic layer are magnetically fixed or pinned, while the magnetization direction of another magnetic layer may be free to switch between the same and opposite directions that are called "parallel" and "antiparallel" states, respectively. Corresponding to the parallel and antiparallel magnetic states, the magnetic memory element has low (logic "0" state) and high (logic "1" state) electrical resistance states, respectively. Accordingly, a detection of the resistance allows a magnetoresistive memory element, such as an MTJ device, to provide information stored in the magnetic memory element. There are two completely different methods used to program the free layer: field switching and spin-torque switching. In field-switched MRAM, current carrying lines adjacent to the MTJ bit are used to generate magnetic fields that act on the free layer. In spin-torque MRAM, switching is accomplished with a current pulse through the MTJ itself. The angular momentum carried by the spin-polarized tunneling current causes reversal of the free layer, with the final state (parallel or antiparallel) determined by the polarity of the current pulse. A reset current pulse will cause the final state to be parallel or logic "0". A set current pulse, in the opposite polarity of the reset current pulse, will cause the final state to be antiparallel or logic "1". Spin-torque transfer is known to occur in MTJ devices and giant magnetoresistance devices that are patterned or otherwise arranged so that the current flows substantially perpendicular to the interfaces, and in simple wire-like structures when the current flows substantially perpendicular to a domain wall. Any such structure that exhibits magnetoresistance has the potential to be a spin-torque magnetoresistive memory element.

Spin-torque MRAM (ST-MRAM), also known as spin-torque-transfer RAM (STT-RAM), is an emerging memory technology with the potential for non-volatility with unlimited endurance and fast write speeds at much higher density than field-switched MRAM. Since ST-MRAM switching current requirements reduce with decreasing MTJ dimensions, ST-MRAM has the potential to scale nicely at even the most advanced technology nodes. However, increasing variability in MTJ resistance and sustaining relatively high switching currents through bit cell select devices in both current directions can limit the scalability of ST-MRAM.

An ST-MRAM array includes a plurality of core strips, with each core strip including a bit cell array comprising a plurality of columns of bit cells (a magnetic tunnel junction and a select transistor). Each column of a core strip is selected individually by a column select multiplexer controlled by a column address and each bit cell within the selected column is selected by the application of a voltage to the gate of the word line select transistor of that bit cell controlled by the row address. The number of address bits does not allow further selection of a single core strip out of a plurality of core strips because the multiple core strips in parallel each receive data from or provide data to a standard data path that is accessible by the user through data input or output pins. Even if the address bus is extended or time multiplexed to provide a core strip address, a separate decode circuit for core strip selection of a bit (magnetic tunnel junction) consumes a significant amount of space on the chip.

Often for test or failure analysis it is beneficial to know the resistance of a bit within a core strip of the bit cell array. This requires performing an analog read of the bit where voltage or current is applied to both terminals of the bit and a resulting current or voltage is measured. Additional selection circuitry needed to individually address each of a plurality of core strips for analog read circuitry reduces area on the chip for other functions.

Alternately, to debug noise issues in a chip, it is beneficial to selectively enable or disable a read or write operation to a bit within a core strip of the bit cell array. Selectively enabling the circuitry used to read or write a bit requires individually addressing each of the multiple core strips and the additional selection circuitry would add area to the chip.

Data stored in memory is often defined in banks. Access to a bank in a double data rate (DDR) memory generally includes an ACTIVATE operation, followed by several READ/WRITE operations and a PRECHARGE operation. The ACTIVATE operation opens a row (or page) of for example 1,000 or more bits. The READ/WRITE operation performs the reading or writing of columns, e.g., 128 bits, in the open row. The PRECHARGE operation closes the row.

During the ACTIVATE operation, a page of data is read from the memory array and stored in local data-store latch in the data path for subsequent READ and WRITE operations from and to the local data-store latch. The ACTIVATE operation can be initiated by an ACTIVATE command or any other command that performs the same operation. During a PRECHARGE operation, the data from local data-store latch is written back to the memory array, and as a result, that page is considered closed or not accessible without a new ACTIVATE operation. The PRECHARGE operation can be initiated by a PRECHARGE or AUTO-PRECHARGE command or any other command that performs the same operation.

DDR memory controllers may want to access less number of bits, for example 128 bits, than the full row or page, for example 1024 bits, of the memory. In such a case, the whole row or page must be opened during the ACTIVATE operation as known in the prior art. ACTIVATE operation consumes unnecessary power from reading the portion of a page that will not be accessed in subsequent READ or WRITE operations. Furthermore, a PRECHARGE operation must close that portion of a page as well contributing to unnecessary power consumption. Therefore, it is desirable to provide a method for selectively opening a portion of the page during an ACTIVATE operation, accessing the open portion of the page in subsequent READ or WRITE operations, and closing the same portion of the page with a PRECHARGE operation.

Accordingly, it is desirable to provide a method for selectively enabling the circuitry for performing an analog read, digital read, or write operation to a bit in a bit cell array during debug, test, and failure analysis while minimizing the added chip area by reusing elements of the standard data path. Furthermore, other desirable features and characteristics of the exemplary embodiments will become apparent from the subsequent detailed description and the appended claims, taken in conjunction with the accompanying drawings and the foregoing technical field and background.

BRIEF SUMMARY

A method and apparatus are provided for performing an analog reading of resistances of a spin-torque magnetoresistive random access memory.

A first exemplary embodiment is a method of reading the state of a bit from an array of resistive memory elements, the method comprising storing input data in circuitry configured to store data to be written to or read from the array of resistive memory elements; and performing a read operation on the bit in response to the input data.

A second exemplary embodiment is an array or resistive memory elements including a plurality of core strips, each core strip comprising a plurality of columns of bits, the array comprising a latch configured to store digital data that will be written to or read from the plurality of column of bits; and an analog read circuit coupled to the plurality of columns of bits and configured to be enabled by the digital data stored in the latch to read a resistance of each of the bits.

A third exemplary embodiment is method of accessing a memory with an array of resistive memory elements, the method comprising storing data in one of data storage circuitry or reconfiguration circuitry to select at least a portion of a page; performing an activate operation to the selected portion of the page; performing one of a read or write operation to read data from or to write data to, respectively, the data storage circuitry corresponding to the selected portion of the page; and performing a pre-charge operation to the selected portion of the page.

BRIEF DESCRIPTION OF THE DRAWINGS

The present invention will hereinafter be described in conjunction with the following drawing figures, wherein like numerals denote like elements.

DETAILED DESCRIPTION

Figure 1:
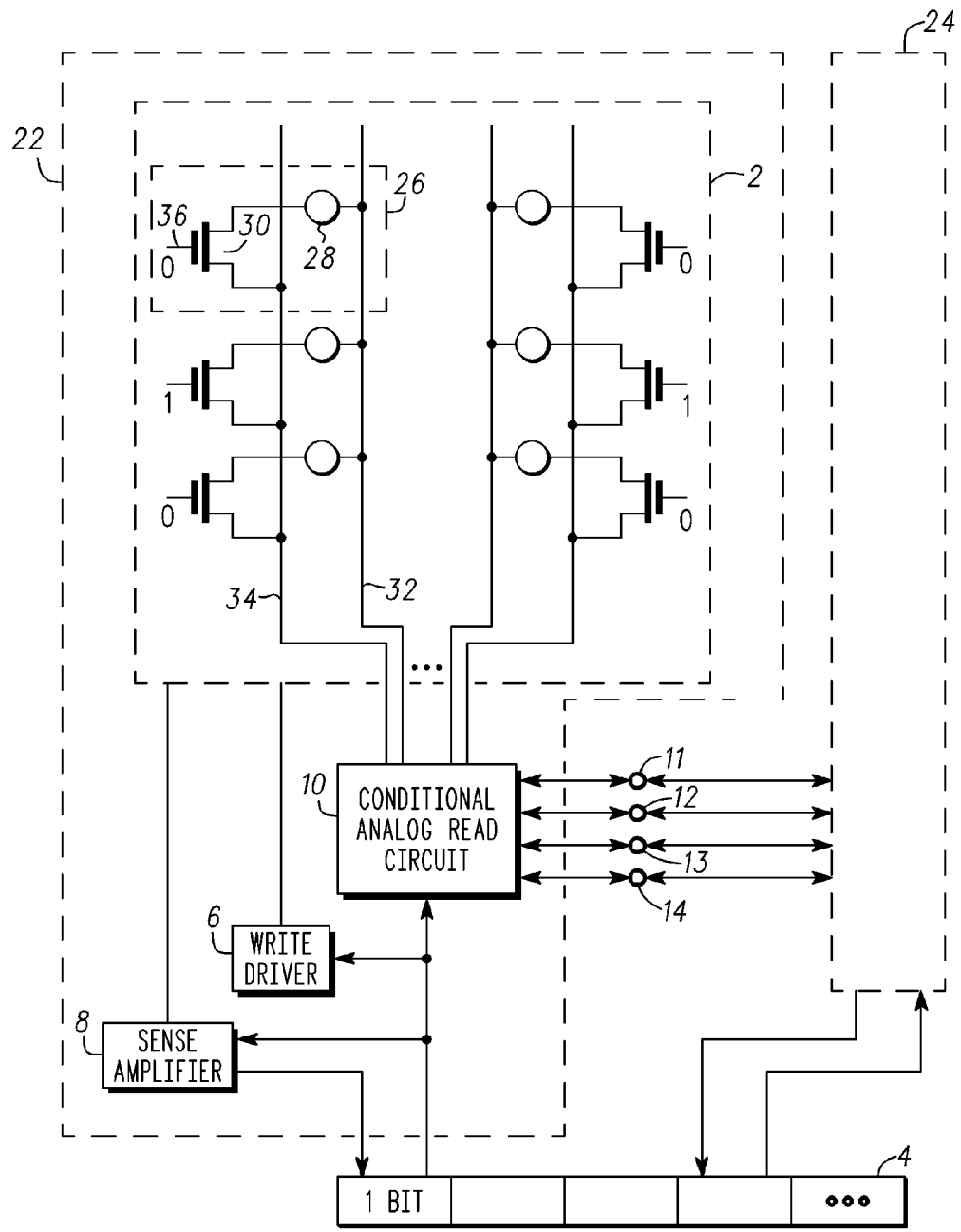
FIG. 1 is a partial circuit diagram of an ST-MRAM including a conditional analog read circuit in accordance with a first exemplary embodiment.

The following detailed description is merely illustrative in nature and is not intended to limit the embodiments of the subject matter or the application and uses of such embodiments. Any implementation described herein as exemplary is not necessarily to be construed as preferred or advantageous over other implementations. Furthermore, there is no intention to be bound by any expressed or implied theory presented in the preceding technical field, background, brief summary, or the following detailed description.

An analog read circuit for determining the resistance of each of the magnetic bits is coupled to a spin-torque magnetoresistive memory array, the array including a plurality of core strips and each core strip including a plurality of columns of magnetic bits. A write driver and a sense amplifier are each coupled between a latch and the plurality of columns of magnetic bits in a core strip for writing to, and reading from, respectively, a magnetic bit. Data within the latch or data provided to input pins coupled to the analog read circuit determine whether the analog read circuit is selected for operation.

The method described herein includes storing input data in a latch of an array of resistive memory elements including a plurality of bits, the latch being configured to store input data that is to be written to or read from the array, and determining in response to the input data whether to read the state of a bit in the plurality of bits. The reading of the state of the bits may result in a digital data output or an analog output in the form of a voltage, current, or impedance. Additionally, the input data stored in the latch may be obtained from the bits or an external input.

The exemplary embodiment describes selectively performing one read operation per core strip with only one analog read circuit being active at a time based on the latched data for the core strip, thereby eliminating the need for circuitry, in addition to the known decode circuit, for each core strip by reusing the latch configured for use in the known data path. Having only one analog read circuit active for the array reduces the metal routing required by having only four analog read input and output lines/pads.

Furthermore, the method described herein applies to digital read circuits to read the bit states. In a destructive self-referenced read scheme, a reset write driver is used to reset the bit to logic "0" during the destructive phase of sensing. A data-masking scheme controls the number of such digital read circuits activated in parallel. Power supply noise from the reset write pulses can be modulated with a data-masked read operation by selecting the number of bits to read/reset.

For simplicity and clarity of illustration, the drawing figures depict the general structure and/or manner of construction of the various embodiments. Descriptions and details of well-known features and techniques may be omitted to avoid unnecessarily obscuring other features. Elements in the drawings figures are not necessarily drawn to scale: the dimensions of some features may be exaggerated relative to other elements to improve understanding of the example embodiments.

Terms of enumeration such as "first," "second," "third," and the like may be used for distinguishing between similar elements and not necessarily for describing a particular spatial or chronological order. These terms, so used, are interchangeable under appropriate circumstances. The embodiments of the invention described herein are, for example, capable of use in sequences other than those illustrated or otherwise described herein.

The terms "comprise," "include," "have" and any variations thereof are used synonymously to denote non-exclusive inclusion. The term "exemplary" is used in the sense of "example," rather than "ideal."

In the interest of conciseness, conventional techniques, structures, and principles known by those skilled in the art may not be described herein, including, for example, standard magnetic random access memory (MRAM) process techniques, fundamental principles of magnetism, and basic operational principles of memory devices.

During the course of this description, like numbers may be used to identify like elements according to the different figures that illustrate the various exemplary embodiments.

Techniques and technologies may be described herein in terms of functional and/or logical block components, and with reference to symbolic representations of operations, processing tasks, and functions that may be performed by various computing components or devices. Such operations, tasks, and functions are sometimes referred to as being computer-executed, computerized, software-implemented, or computer-implemented. In practice, one or more processor devices can carry out the described operations, tasks, and functions by manipulating electrical signals representing data bits at memory locations in the system memory, as well as other processing of signals. The memory locations where data bits are maintained are physical locations that have particular electrical, magnetic, optical, resistive, or organic properties corresponding to the data bits. It should be appreciated that the various clock, signal, logic, and functional components shown in the figures may be realized by any number of hardware, software, and/or firmware components configured to perform the specified functions. For example, an embodiment of a system or a component may employ various integrated circuit components, e.g., memory elements, digital signal processing elements, logic elements, look-up tables, or the like, which may carry out a variety of functions under the control of one or more microprocessors or other control devices.

For the sake of brevity, conventional techniques related to programming memory, and other functional aspects of certain systems and subsystems (and the individual operating components thereof) may not be described in detail herein. Furthermore, the connecting lines shown in the various figures contained herein are intended to represent exemplary functional relationships and/or physical couplings between the various elements. It should be noted that many alternative or additional functional relationships or physical connections may be present in an embodiment of the subject matter.

A magnetoresistive random access memory (MRAM) array includes write current drivers and sense-amplifiers positioned near a plurality of magnetoresistive bits. A write, or program, operation begins when a current of either one of the two different and opposite polarities, set or reset, is applied through the magnetic storage element, e.g., MTJ. Such write mechanism is employed in spin torque transfer (STT) or spin torque (ST) MRAM. The spin-torque effect is known to those skilled in the art. Briefly, a current becomes spin-polarized after the electrons pass through the first magnetic layer in a magnetic/non-magnetic/magnetic tri-layer structure, where the first magnetic layer is substantially more stable than the second magnetic layer. The higher stability of the first layer compared to the second layer may be determined by one or more of several factors including: a larger magnetic moment due to thickness or magnetization, coupling to an adjacent antiferromagnetic layer, coupling to another ferromagnetic layer as in a SAF structure, or a high magnetic anisotropy. The spin-polarized electrons cross the nonmagnetic spacer and then, through conservation of spin angular momentum, exert a spin torque on the second magnetic layer that causes precession of its magnetic moment and switching to a different stable magnetic state if the current is in the proper direction. When net current of spin-polarized electrons moving from the first layer to the second layer exceeds a first critical current value, the second layer will switch its magnetic orientation to be parallel to that of the first layer. If a bias of the opposite polarity is applied, the net flow of electrons from the second layer to the first layer will switch the magnetic orientation of the second layer to be antiparallel to that of the first layer, provided the magnitude of the current is above a second critical current value. Switching in this reverse direction involves a fraction of the electrons reflecting from the interface between the spacer and the first magnetic layer and traveling back across the nonmagnetic spacer to interacting with the second magnetic layer.

Magnetoresistance (MR) is the property of a material to change the value of its electrical resistance depending on its magnetic state. Typically, for a structure with two ferromagnetic layers separated by a conductive or tunneling spacer, the resistance is highest when the magnetization of the second magnetic layer is antiparallel to that of the first magnetic layer, and lowest when they are parallel. Therefore, ST-MRAM is an example of a memory array with resistive memory elements.

FIG. 1 is a partial schematic diagram of an ST-MRAM array 16. An ST-MRAM bit cell array 2 is coupled to a data storage latch 4 by both a write driver 6 and a sense amplifier 8. The write driver 6 operates in a known manner for writing data from the data storage latch 4 to the array 2 and the sense amplifier 8 operates in a known manner by reading data from the array 2 for storage in the data storage latch 4. The data storage latch 4 comprises multiple bits and is a part of the data path in a memory array. For simplicity and brevity, other known circuit blocks in a memory, such as a column multiplexer, a word line driver, row and column address decode circuit, that can be coupled between the bit cell array 2 and rest of the circuits in FIG. 1, are not shown in FIG. 1.

In accordance with a first exemplary embodiment, a conditional analog read circuit 10 is coupled between the data storage latch 4 and the bit cell array 2 for performing analog reading of the bit cell array 2 in response to a first bit line signal 11, a second bit line signal 12, a first source line signal 13, and a second source line signal 14.

The ST-MRAM array 16 includes a plurality of core strips 22, 24 with each core strip including a plurality of magnetic bit cells 26. Each magnetic bit cell 26 includes a magnetic tunnel junction device 28 and a word line select transistor 30. Within each core strip 22, 24 each magnetic bit 26 is coupled between a bit line 32 and a first electrode of a word line select transistor 30, while a second electrode of each word line select transistor 30 is coupled to a source line 34. A control electrode of each word line select transistor 30 is coupled to a voltage word line 36 (one of the voltage word lines 36 is coupled to a single select transistor (not shown) within each core strip 22, 24). A bit from latch 4 is coupled to the sense amplifier 8, write driver 6, and conditional analog read circuit 10. In another embodiment, a portion of latch 4 including the bit from latch 4 coupled to the core strip 22 may be located inside the core strip 22. Yet in another embodiment, sense amplifier 8 and conditional analog read circuit 10 in the core strip 22 may be coupled to a different bit in latch 4 than the bit coupled to the write driver 6.

Figure 2:
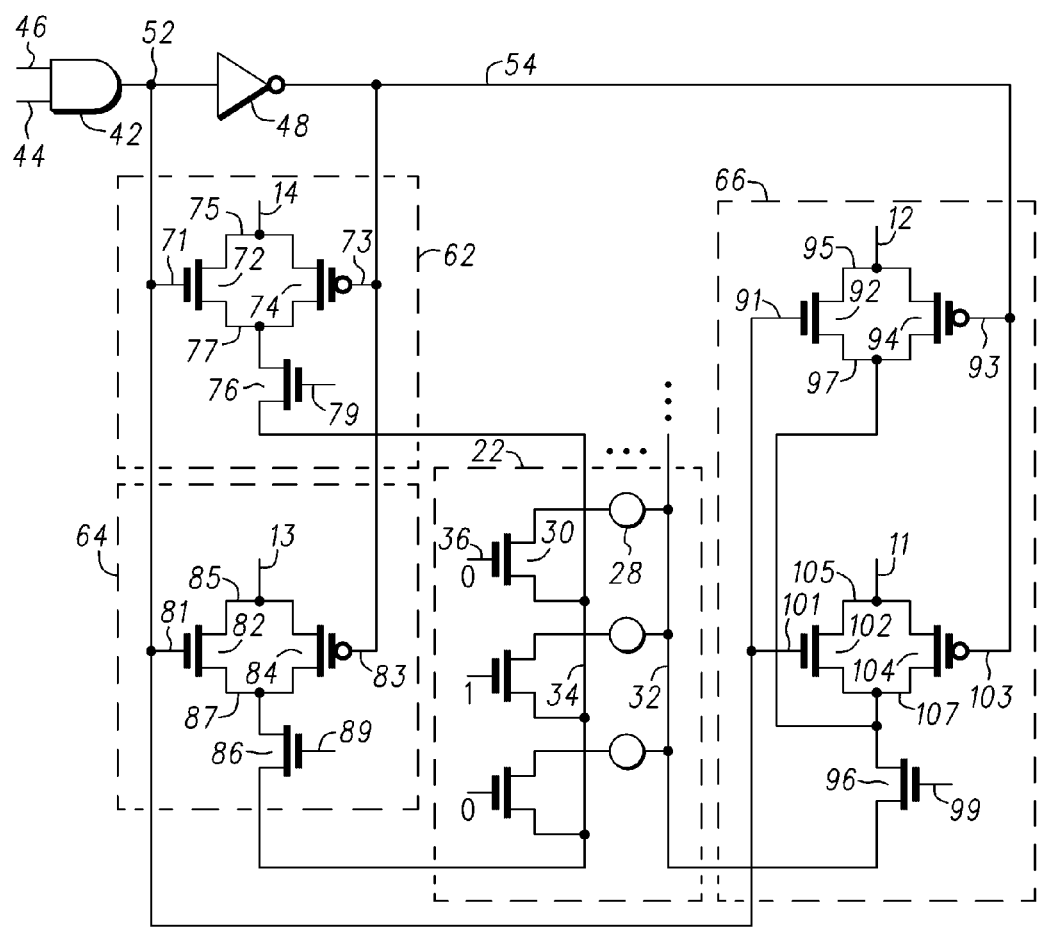
FIG. 2 is a circuit diagram of the conditional analog read circuit coupled to a column of ST-MRAM bit cells in accordance with the first exemplary embodiment.

Referring to FIG. 2, a more detailed circuit schematic of the analog read circuit 10 includes an AND circuit 42, an inverter 48, and first, second, and third column multiplexers 62, 64, 66 coupled to the core strip 22. The AND circuit 42 is configured to receive a data input 44 from the latch, and an analog read mode select signal 46. The inverter 48 is coupled to receive an enable signal 52 from the AND circuit 42 and provide an enable bar signal 54.

First, second, and third column multiplexers 62, 64, 66 are coupled to receive the enable signal 52 and the enable bar signal 54. The first column multiplexer 62 has opposed transistors 72 and 74 and a source line select transistor 76. The first transistor 72 has a control electrode 71 coupled to receive the enable signal 52. The second transistor 74 has a control electrode 73 coupled to receive the enable bar signal 54. First and second transistors 72, 74 have a first current carrying electrode 75 coupled to receive the second source line signal 14, and a second current carrying electrode 77 coupled to the source line 34 at the top of the bit cell column 22 by a source line select transistor 76. A control electrode 79 of the source line select transistor 76 is coupled to receive a source line select signal. The current carrying electrode 77 may be coupled to multiple bit cell columns, for example, the core strip 22, through multiple source line select transistors, for example, the transistor 76. Only one source line select transistor would be active during analog read with a positive voltage at its control electrode. For simplicity and brevity, FIG. 2 shows only bit cell column 22 and one source line select transistor 76 in column multiplexer 62.

The second column multiplexer 64 includes opposed transistors 82 and 84 and a source line select transistor 86. The transistor 82 has a control electrode 81 coupled to receive the enable signal 52. The transistor 84 has a control electrode coupled to receive the enable bar signal 54. Transistors 82, 84 both have a first current carrying electrode 85 coupled to receive the first source line signal 13, and a second current carrying electrode 87 coupled to the source line 34 at the bottom of the bit cell column 22 by a source line select transistor 86. A control electrode 89 of the source line select transistor 86 is coupled to receive a source line select signal. Similar to column multiplexer 62, only one bit cell column 22 and one source line select transistor 86 are shown to be coupled with opposed transistors 82 and 84 for brevity.

The third column multiplexer 66 includes opposed transistors 92 and 94 and a bit line select transistor 96. The transistor 92 has a control electrode 91 coupled to receive the enable signal 52. The transistor 94 has a control electrode coupled to receive the enable bar signal 54. Transistors 92, 94 both have a first current carrying electrode 95 coupled to receive the second bit line signal 12, and a second current carrying electrode 97 coupled to the bit line 32 at the either the bottom or top of the bit cell column 22 by a bit line select transistor 96. A control electrode 99 of the bit line select transistor 96 is coupled to receive a bit line select signal.

The third column multiplexer 66 additionally has opposed transistors 102 and 104. The transistor 102 has a control electrode 101 coupled to receive the enable signal 52. The transistor 104 has a control electrode 103 coupled to receive the enable bar signal 54. Transistors 102, 104 both have a first current carrying electrode 105 coupled to receive the first bit line signal 11, and a second current carrying electrode 107 coupled to the bit line 32 at either the bottom or top of the bit cell column 22 by the bit line select transistor 96. In another embodiment, the bit line 32 can be accessed from the top and bottom ends using fourth and fifth column multiplexers (not shown).

Figure 3:
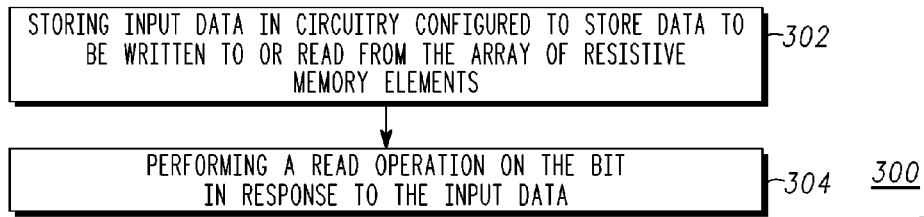
FIG. 3 is a flow chart of a method of performing a read of a memory array with a plurality of resistive memory elements in accordance with a second exemplary embodiment.
Figure 4:
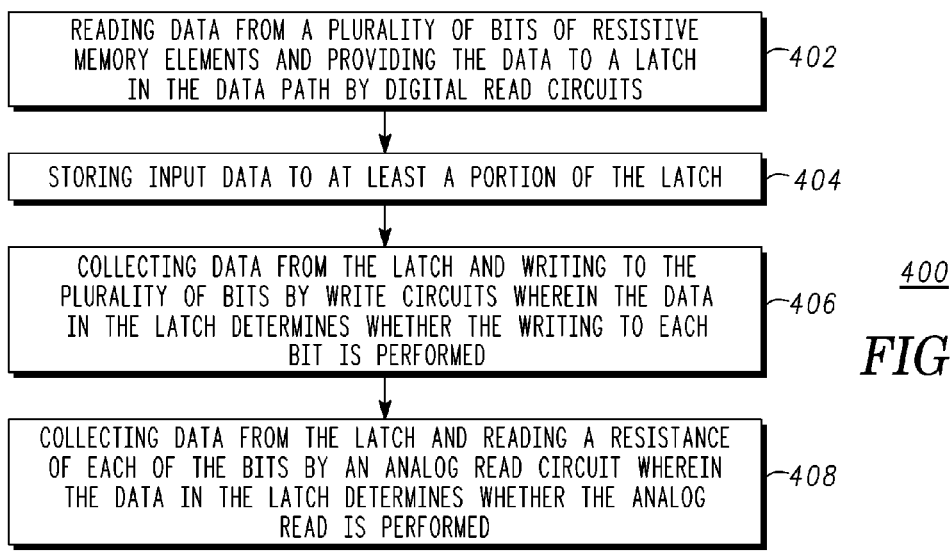
FIG. 4 is a flow chart of a method of performing read and write of a memory array with a plurality of resistive memory elements in accordance with a third exemplary embodiment.

FIGS. 3 and 4 are flow charts that illustrate a second exemplary method 300 of reading and an exemplary embodiment of method 400 of reading and writing, respectively, in the spin-torque magnetoresistive memory array and in a memory array comprising of resistive memory elements in general. For illustrative purposes, the following description of methods 300 and 400 may refer to elements mentioned above in connection with FIGS. 1 and 2. It should be appreciated that methods 300 and 400 may include any number of additional or alternative tasks, the tasks shown in FIGS. 3 and 4 need not be performed in the illustrated order, and methods 300 and 400 may be incorporated into a more comprehensive procedure or method having additional functionality not described in detail herein. Moreover, one or more of the tasks shown in FIGS. 3 and 4 could be omitted from other embodiments of the methods 300 and 400 as long as the intended overall functionality remains intact.

Referring to FIG. 3, the exemplary method includes storing 302 data in circuitry, such as a latch, configured to store data to be written to or read from the array of resistive memory elements including a plurality of bits, and selectively performing a read operation 304 in response to the data. For example, data of a first state (1) performs the read operation while data of a second state (0) does not perform the read operation. The read operation 304 may comprise either an analog read or a digital read.

The exemplary method of FIG. 4 includes reading 402 data from a plurality of bits of resistive memory elements and providing the data to a latch in the data path by digital read circuits; storing 404 input data to at least a portion of the latch; collecting 406 data from the latch and writing to the plurality of bits by write circuits wherein the data in the latch determines if the writing to each bit is performed or not; and collecting 408 data from the latch and reading a resistance of each of the bits by an analog read circuit wherein the data in the latch determines whether the analog read is performed.

Figure 5:
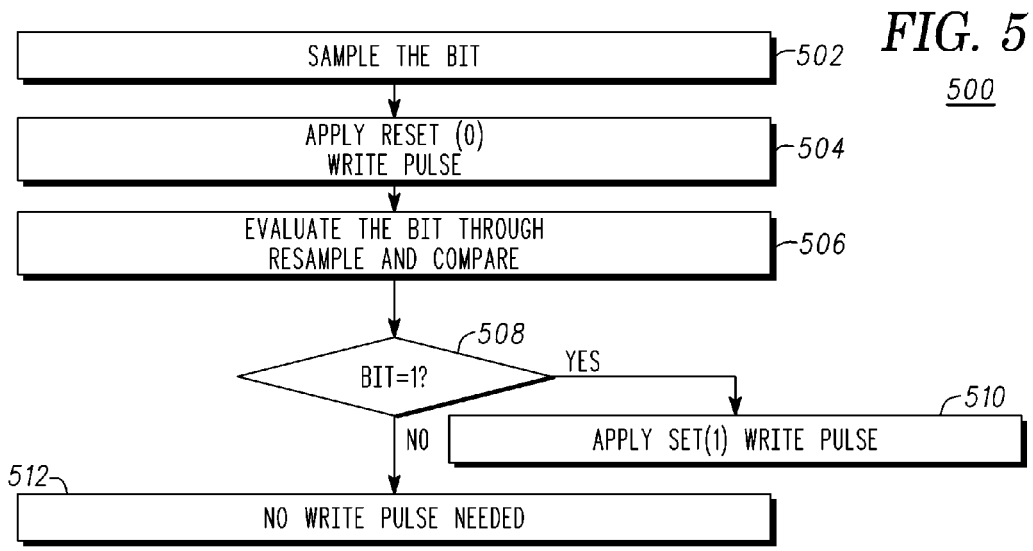
FIG. 5 is a flow chart of a method of performing a digital read using a destructive self-reference read with write-back of an ST-MRAM array in accordance with a fourth exemplary embodiment.

FIG. 5 is a flow chart that illustrates another exemplary method of performing of the read operation in step 304 in process 300, and step 402 in process 400, using a destructive self-referenced read operation with a write-back process 500. For illustrative purposes, the following description of process 500 may refer to elements mentioned above in connection with FIGS. 1 and 2. It should be appreciated that process 500 may include any number of additional or alternative tasks, the tasks shown in FIG. 5 need not be performed in the illustrated order, and process 500 may be incorporated into a more comprehensive procedure or process having additional functionality not described in detail herein. Moreover, one or more of the tasks shown in FIG. 5 could be omitted from an embodiment of the process 500 as long as the intended overall functionality remains intact.

This exemplary embodiment 500 of destructive read with write-back in the ST-MRAM array 18 includes first sampling 502 a magnetic bit 28 to provide and store a sampled voltage. An exemplary sample operation is applying a desired voltage, Vbit, across a bit; converting the resulting current through the bit into a voltage, Vsample; and storing Vsample into a capacitor. A reset write current pulse is applied 504 to set the bit to 0 (equivalent to a logic state "0"). The bit state is evaluated 506 by resampling a voltage after step 504 is complete and comparing the resampled voltage with the sampled voltage from step 502. An exemplary resample and evaluate operation is applying the same desired voltage, Vbit, from step 502 across the bit; comparing the resulting current through the bit added with a programmable offset current with the current due to Vsample from step 502 to generate a voltage, Veval; and comparing Veval with Vsample from step 502 to evaluate the bit state. The bit state is determined to be either 0 or 1 depending on the sampled voltage levels from 502 and 506. For example, if sampled voltage from 506 is higher than that from step 502, the bit state is 0. The sampled voltage levels can be compared in multiple ways to resolve the bit state. Comparison of the sampled voltage levels essentially indicates if the bit has changed state after step 504 from its initial state (at the beginning of method 500). If 508 the bit state is 1, a set write current pulse is applied 510 to set the bit to 1, thus performing a write-back to restore the bit state. If 508 the bit state is not 1, no write pulse is needed 512. Referring to FIGS. 1 and 2, the word line voltage level 36 during steps 502, 504, 506 is at a different level than the write-back step 510.

Figure 6:
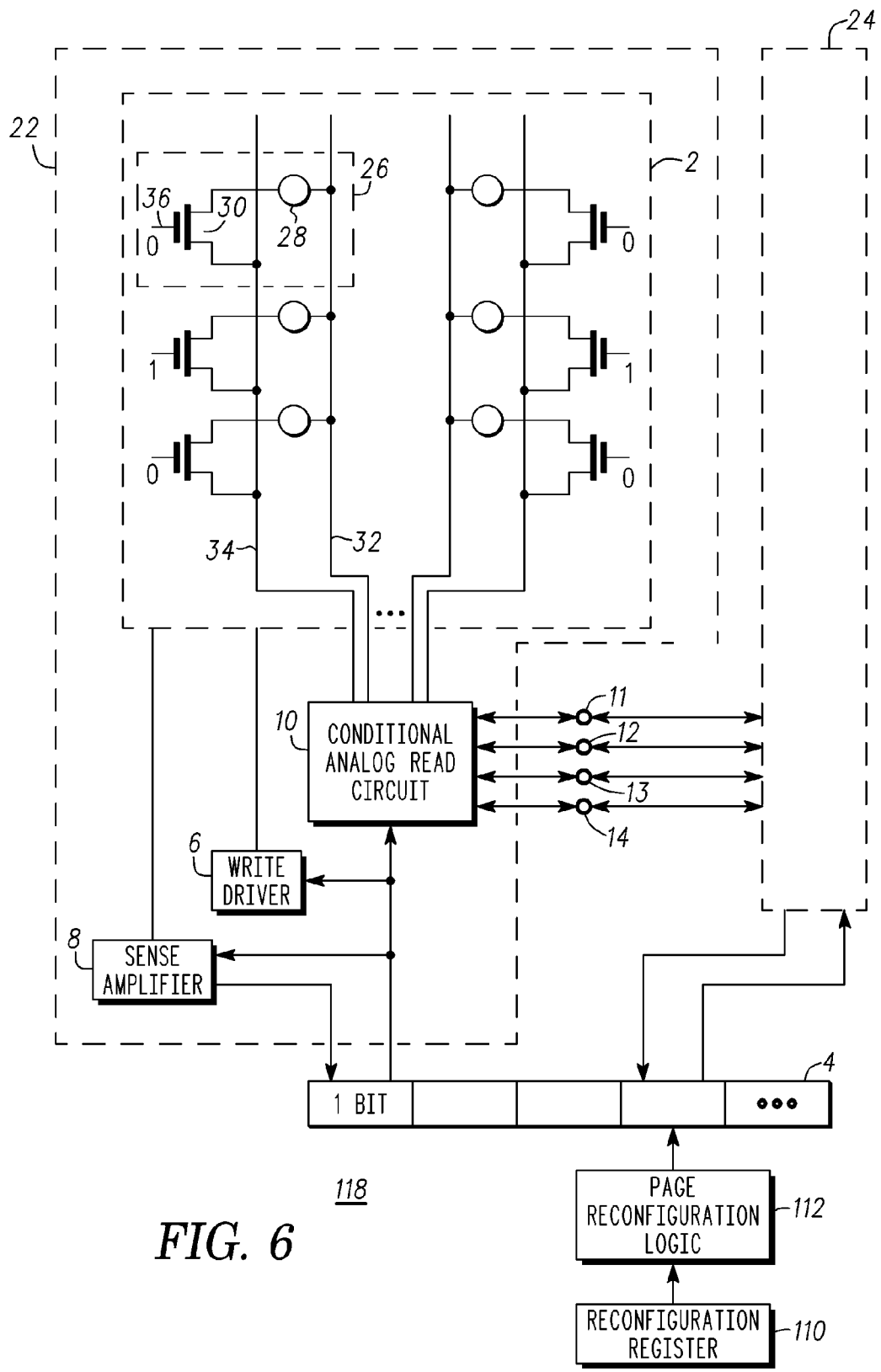
FIG. 6 is a partial circuit diagram of an ST-MRAM including a configuration register in accordance with a fifth exemplary embodiment.

FIG. 6 is a partial circuit schematic of an ST-MRAM array 118 in accordance with an exemplary embodiment wherein like numbers are used to identify like elements of FIG. 1. In the circuit of FIG. 6, a reconfiguration register 110 is coupled to a page reconfiguration logic 112 that is further coupled to the latch 4. The reconfiguration register 110 has fewer bits than that of the latch 4. The total number of bits in the latch 4 will typically determine the page size. Based on the data stored in the reconfiguration register 110, a portion of the bits in latch 4 can be set to a predetermined data, such as 1, using the page reconfiguration logic 112 to selectively read from the bit cell array 2 using the sense amplifier 8 or conditional analog read circuit 10 and write to the bit cell array 2 using write driver 6. Thus, the page size is made programmable.

Figure 7:
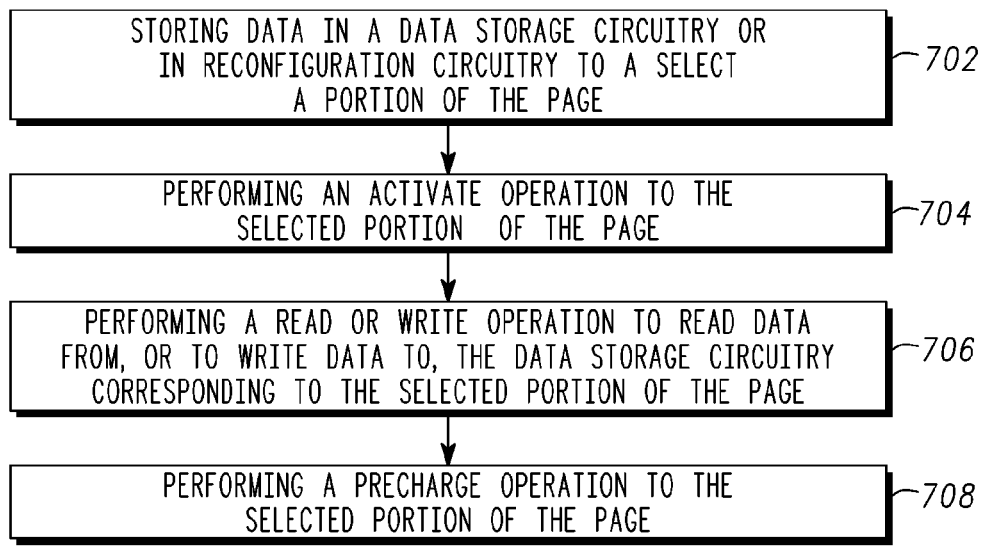
FIG. 7 is a flow chart of a method of performing memory access operations in accordance with the fifth exemplary embodiment.

FIG. 7 is a flow chart of another exemplary method of performing ACTIVATE, READ, WRITE, and PRECHARGE operations in a memory in accordance the exemplary embodiment of FIG. 6. For illustrative purposes, the following description of process 700 may refer to elements mentioned above in connection with FIG. 6 or with the steps in process 500. It should be appreciated that process 700 may include any number of additional or alternative tasks, the tasks shown in FIG. 7 need not be performed in the illustrated order, and process 700 may be incorporated into a more comprehensive procedure or process having additional functionality not described in detail herein. Moreover, one or more of the tasks shown in FIG. 7 could be omitted from an embodiment of the process 700 as long as the intended overall functionality remains intact.

The exemplary method 700 includes storing data 702 in a data storage circuitry, such as the latch 4, or in a reconfiguration circuitry, such as the reconfiguration register 110, to select a portion of the page, and performing an ACTIVATE operation 704 to the selected portion of the page. During the ACTIVATE operation, the selected portion of the page may be opened by reading the memory data corresponding to the selected portion of the page using the steps 502, 504, 506 of the destructive self-referenced read operation in method 500. At the end of the ACTIVATE operation, the data storage circuitry is updated with the memory data. In 706, a READ or WRITE operation is performed to read data from the data storage circuitry or write data to the data storage circuitry corresponding to the selected portion of the page, respectively. In 708, a PRECHARGE operation is performed to the selected portion of the page. During the PRECHARGE operation, the write-back steps 508, 510, and 512 in method 500 may occur. Alternatively, data for the selected portion of the page in the data storage circuitry can written to the memory during the PRECHARGE operation 700.

While at least one exemplary embodiment has been presented in the foregoing detailed description, it should be appreciated that a vast number of variations exist. For example, in step 504 in process 500, a set write current pulse can be applied to set the bit to 1 (equivalent a logic state "1"), in which case, if 508 the bit state is 0, a reset write current pulse is applied 510 to reset the bit to 0; or if 508 the bit state is not 0, no write pulse is needed. In another embodiment, other logic gate circuits, such as NAND, OR, or NOR, can be used instead of AND circuit 42 in FIG. 2. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention, it being understood that various changes may be made in the function and arrangement of elements described in an exemplary embodiment without departing from the scope of the invention as set forth in the appended claims.

What is claimed is:

1. A method of reading the state of a bit from an array of resistive memory elements, wherein the array comprises a plurality of columns and each column comprises a plurality of bits coupled between a bit line and a source line, the method comprising:
   storing input data in circuitry, the circuitry is configured to store data to be written to or read from the array of resistive memory elements; and
   performing a first read operation on the bit in response to the input data, the performing step further comprising:
   providing one of a digital data output comprising:
   sampling a resistance of the bit; or
   providing an analog output comprising:
   providing a first current or a first voltage to a first end of the source line; and
   providing a second current or a second voltage to a first end of the bit line.

2. The method of claim 1 wherein the providing an analog output step comprises providing one of the outputs selected from the group consisting of a voltage, a current, or an impedance.

3. The method of claim 1, wherein providing the digital data output further comprises:
   writing the bit to a first state;
   resampling the resistance;
   comparing the sampling and resampling of the resistance;
   determining whether the bit changed from a second state to the first state;
   providing the digital data output in response to the determining step; and
   writing the bit to the second state if the bit changed from the second state to the first state.

4. The method of claim 3, further comprising:
   applying a first word line voltage to select the bit during the sampling, writing to a first state, and resampling; and
   applying a second word line voltage to select the bit during the writing to the second state.

5. The method of claim 1, further comprising:
   writing the input data to the bit.

6. The method of claim 1 further comprising:
   storing the digital data output in the circuitry.

7. The method of claim 1, wherein the providing an analog output step further comprises:

providing a third current or a third voltage to a second end of the source line.

8. The method of claim 7, further comprising:
measuring a voltage at the second end of the source line when a current is provided to the second end, or measuring a current at the second end of the source line when a voltage is provided to the second end.

9. The method of claim 7, further comprising:
measuring a voltage at the first end of the bit line when a current is provided to the first end of the bit line, or measuring a current at the first end of the bit line when a voltage is provided to the first end of the bit line.

10. The method of claim 1, wherein the resistive memory elements are spin torque magnetoresistive memory elements.

11. The method of claim 1 wherein the performing the first read operation while providing a digital output further includes:
performing an ACTIVATE operation to a selected portion of a page of the input data.

12. The method of claim 11 wherein performing an ACTIVATE operation further comprises:
writing the bit to a first state;
resampling the resistance;
comparing the sampling and resampling of the resistance;
determining whether the bit changed from a second state to the first state;
providing the digital data output in response to the determining step; and
storing the digital output in the data storage circuitry.

13. The method of claim 11 further comprising:
performing one of a second READ operation or a WRITE operation to read data from or to write data to, respectively, the circuitry corresponding to the selected portion of the page; and
performing a PRECHARGE operation to the selected portion of the page.

14. The method of claim 13 wherein performing a PRECHARGE operation further comprises:
writing the bit according to the data in the data storage circuitry corresponding to the selected portion of the page.

15. The method of claim 13 wherein performing a PRECHARGE operation further comprises:
writing the bit to the second state if the bit changed from the second state to the first state.

* * * * *